United States Patent [19]

Nakahara

[11] Patent Number: 4,697,333

[45] Date of Patent: Oct. 6, 1987

[54] METHOD OF MANUFACTURING A SEMICONDUCTOR DEVICE USING AMORPHOUS SILICON AS A MASK

[75] Inventor: Moriya Nakahara, Kawasaki, Japan

[73] Assignee: Kabushiki Kaisha Toshiba, Kawasaki, Japan

[21] Appl. No.: 830,831

[22] Filed: Feb. 19, 1986

[30] Foreign Application Priority Data

Feb. 20, 1985 [JP] Japan .................................. 60-30508

[51] Int. Cl.[4] .................. H01L 21/265; H01L 21/308
[52] U.S. Cl. .............................. 437/20; 148/DIG. 61;
148/DIG. 82; 357/91; 437/233
[58] Field of Search ............... 29/571, 576 B; 148/1.5,
148/187; 357/91, 23

[56] References Cited

U.S. PATENT DOCUMENTS

| 4,472,210 | 9/1984 | Wu et al. | 148/1.5 |
| 4,488,351 | 12/1984 | Momose | 29/576 B |
| 4,502,205 | 3/1985 | Yahano | 29/576 B |
| 4,555,842 | 12/1985 | Levinstein et al. | 29/571 |
| 4,584,026 | 4/1986 | Wu et al. | 148/1.5 |
| 4,597,824 | 7/1986 | Shinada et al. | 29/571 |
| 4,599,118 | 7/1986 | Han et al. | 148/1.5 |

OTHER PUBLICATIONS

Liu et al., "Channeling Effect of Low Energy Boron Implant in (100) Silicon," *IEEE Electron Device Letters*, vol. EDL-4, No. 3, Mar. 1983.

Yamada et al., "Formation of Shallow p+n Junction by Low Temperature Annealing," *Japanese Journal of Applied Physics*, vol. 22, Supplement 22-1, pp. 157-160, 1983.

Kwizera et al., "Grain Size Increase in Thin Polysilicon Films by Ion Implantation and Annealing, "*VLSI Science and Tech.*, pp. 147-150, 1982.

Chou IBM-TDB, 14 (1971), 250.

*Primary Examiner*—Upendra Roy
*Attorney, Agent, or Firm*—Finnegan, Henderson, Farabow, Garrett & Dunner

[57] ABSTRACT

A method of manufacturing a semiconductor device has the steps of forming an insulating film on a semiconductor substrate, forming a polycrystalline silicon layer on the insulating film, converting either all of the polycrystalline silicon layer or a portion of predetermined thickness of the polycrystalline silicon layer into an amorphous silicon layer, patterning the polycrystalline silicon layer, either all of which or a portion of predetermined thickness of which has been converted into an amorphous silicon layer, and ion-implanting an impurity in the semiconductor substrate using the patterned layer as a mask.

5 Claims, 8 Drawing Figures

METHOD OF MANUFACTURING A SEMICONDUCTOR DEVICE USING AMORPHOUS SILICON AS A MASK

BACKGROUND OF THE INVENTION

The present invention relates to a method of manufacturing a semiconductor device, and more particularly, to a method of manufacturing an MOS type transistor.

Recently, an MOS type transistor using a p-pocket structure to prevent the microdevice punch-through effect without increasing the impurity concentration in a channel region has been proposed. A method of manufacturing an MOS transistor having such a structure will be explained below with reference to FIGS. 1A and 1B.

Element isolation region 2 is formed on the surface of p-type semiconductor substrate 1. Gate electrode 4, of polycrystalline silicon, is then formed on substrate 1 through gate oxide film 3. shallow $n^-$-type regions $5a$ and $5b$ are formed by ion-implanting arsenic in substrate 1, using gate electrode 4 as a mask. Boron is then ion-implanted in substrate 1 at an acceleration voltage of 80 kV and a dose of $3 \times 10^{12}/cm^2$ to form $p^+$-type regions $6a$ and $6b$ (FIG. 1A).

CVD-$SiO_2$ layer 7 is deposited over the entire surface of the resultant structure. Layer 7 is then removed using reactive ion etching (RIE) so that it remains on only the side walls of gate electrode 4 and gate oxide film 3. $N^+$-type regions $8a$ and $8b$ are then formed by ion-implanting phosphorus in substrate 1, using remaining $SiO_2$ layer 7 and gate electrode 4 as masks. Source region 9 consists of regions $5a$ and $8a$, and drain region 10 consists of regions $5b$ and $8b$. $P^+$-type regions, so-called p-pocket regions $11a$ and $11b$, are then formed beneath regions $5a$ and $5b$. Protective film 12 is formed over the entire resultant structure. Contact holes 13 are then formed by selectively removing portions of protective film 12 corresponding to regions $8a$ and $8b$. Finally, Al electrodes 14 are formed in contact holes 13, thus forming an MOS transistor having an LDD (lightly-doped drain) structure (FIG. 1B).

With the conventional manufacturing method described above, however, when ion implantation is performed using gate electrode 4 as a mask, ions not only reach the prospective formation areas for the source and drain regions, but also penetrate through gate electrode 4 and gate insulating film 3 into the underlying substrate. This results in the so-called channeling phenomenon, which causes the problem of variations in the threshold voltage of the transistor. When a p-pocket region is formed by ion-implanting, at a high acceleration voltage, boron which has a small atomic radius, the channeling phenomenon is particularly notable.

It is possible to prevent this ion penetration by increasing the film thickness of gate electrode 4. In this case, however, taking into account the formation of uniformly patterned gate electrode 4 and element evenness, it is not possible to increase the thickness of electrode 4 beyond a certain limit, the ceiling of which is 4,000 to 6,000 Å. As a result, variations in threshold voltage cannot be eliminated.

SUMMARY OF THE INVENTION

It is an object of the present invention to provide a method of manufacturing a semiconductor device which prevents the penetration of ions through an ion implantation mask during ion implantation.

According to the present invention, there is provided a method of manufacturing a semiconductor device, comprising the steps of forming an insulating film on a semiconductor substrate, forming a polycrystalline silicon layer on the insulating film, converting either all of the polycrystalline silicon layer or a portion of the polycrystalline silicon layer, whose thickness is predetermined, into an amorphous silicon layer, patterning the polycrystalline silicon layer, either all of which or a portion of which, whose thickness is predetermined, has been converted into an amorphous silicon layer, and ion-implanting an impurity in the semiconductor substrate using the patterned layer as a mask.

According to the method of the present invention, it is possible to convert a polycrystalline silicon layer into an amorphous silicon layer by ion-implanting an impurity in the polycrystalline silicon layer. For use as the impurity, an atom which has a large atomic radius and which can therefore easily convert polycrystalline silicon to amorphous silicon is preferable. An n-type impurity is preferable, because with p-type ions, the resistance of amorphous silicon increases undesirably.

Preferable atoms are silicon, fluorine, phosphorus, arsenic, and argon atoms.

The acceleration voltage and ion dose for ion implantation need only be sufficient to convert at least a portion of the polycrystalline silicon layer, whose thickness is perdetermined, to an amorphous silicon layer.

The method of the present invention can be applied not only to the manufacture of a MOS transistor, but also to the formation of an electrode of a capacitor formed together on a single substrate with a device requiring ion implantation. Impurity penetration can, in this application, be prevented in the same manner as described above.

DETAILED DESCRIPTION OF THE PREFERRED EMBODIMENT

An embodiment of the present invention, applied to the manufacture of an n-channel MOS transistor having an LDD/p-pocket structure, will be described below with reference to FIGS. 2A to 2F.

Figure 1A:
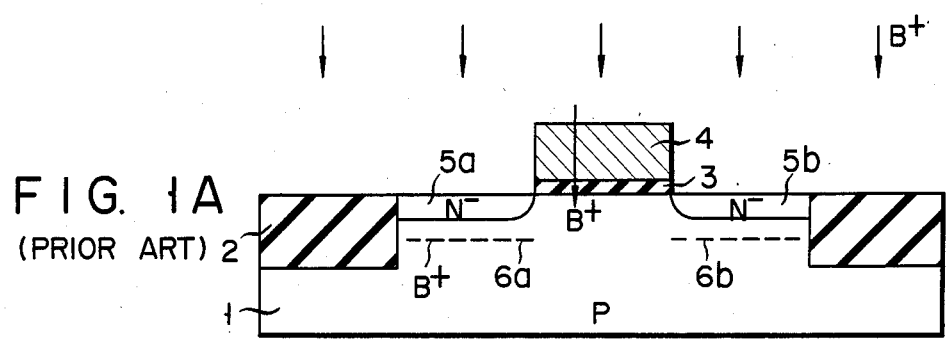
FIGS. 1A and 1B show steps in the manufacture of an n-channel MOS transistor having a conventional LDD/p-pocket structure.
Figure 1B:
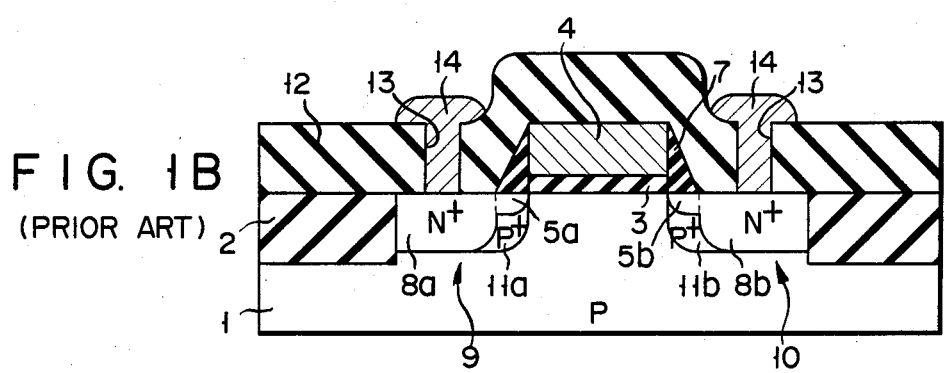
Figure 2A:
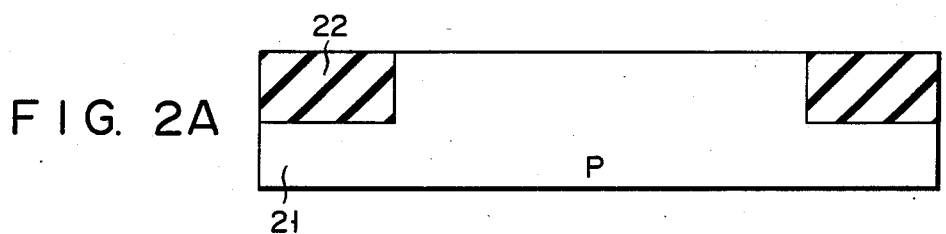
FIGS. 2A to 2F show steps in the manufacture of an n-channel MOS transistor having an LDD/p-pocket structure according to an embodiment of the present invention.
Figure 2B:
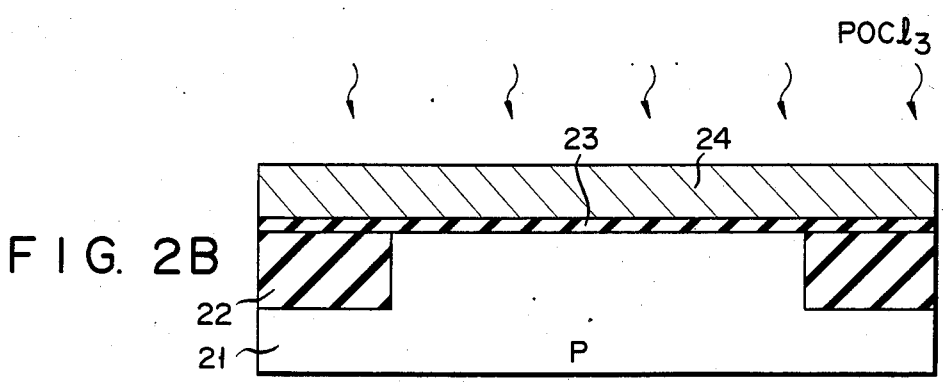
Figure 2C:
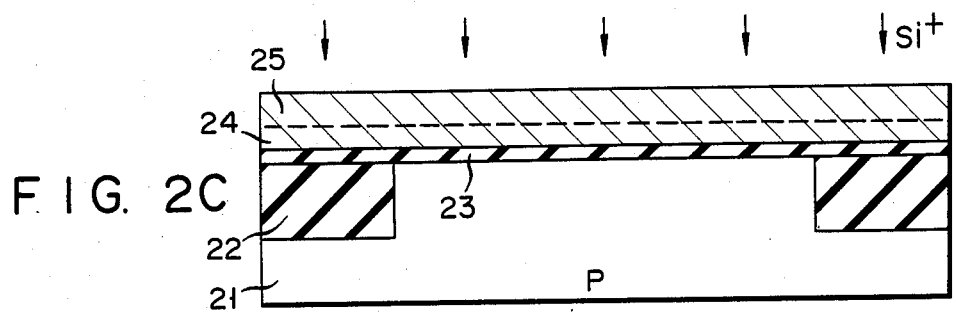
Figure 2D:
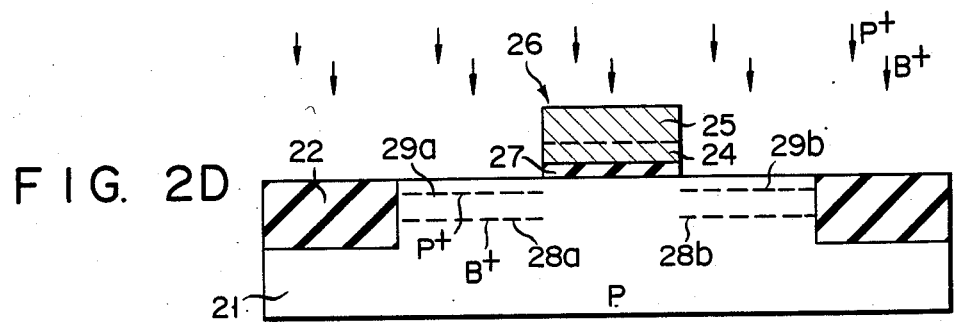

Element isolation region 22 was first formed on the surface of p-type (100) silicon substrate 21 (outside the element region thereof) by selective oxidation (FIG. 2A). Oxide film 23 having a thickness of 250 Å was then formed on the entire surface of substrate 21 in an oxygen atmosphere. Undoped, 4,000 Å thick polysilicon layer 24 was formed. Phosphorus was then diffused into layer 24 using the $POCl_3$ diffusion method (FIG. 2B), and silicon was ion-implanted into the entire surface of layer 24 at an acceleration voltage of 180kV and a dose of $2 \times 10^{15}/cm^2$. As a result, the region from the surface of layer 24 to a depth of about 2,500 Å thereof was converted to amorphous silicon layer 25 (FIG. 2C). Layer 25, layer 24, and oxide film 23 were then properly etched using photolithography, RIE, or a similar method, and gate electrode 26 and gate oxide film 27 were formed. Boron-doped layers 28a and 28b were formed by ion-implanting boron (for p-pocket formation) in substrate 21 at an acceleration voltage of 80 kV and a dose of $3 \times 10^{12}/cm^2$. Phosphorus-doped layers 29a and 29b were then formed by ion-implanting phosphorus (for n⁻-type region formation) at an acceleration voltage of 35 kV and a dose of $2 \times 10^{13}/cm^2$.

Figure 2E:
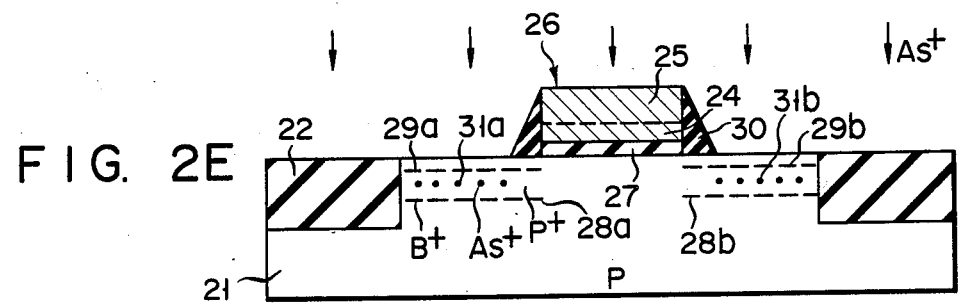
Figure 2F:
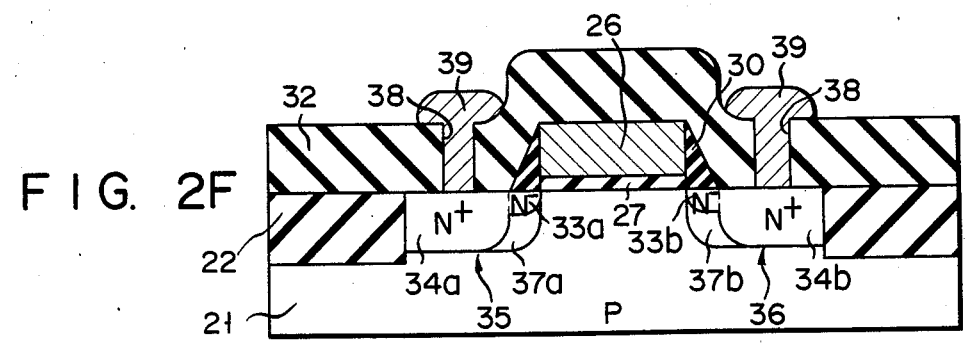

Next, CVD-SiO₂ film 30 was deposited to a thickness of 3,000 Å over the entire surface of the resultant structure. Etching was performed using an RIE technique, so that portions of SiO₂ film 30 were left on only the side walls of gate electrode 26 and gate oxide film 27. Arsenic-doped layers 31a and 31b were then formed by ion-implanting arsenic (for the formation of an n⁺-type region) at an accleration voltage of 40 kV and a dose of $5 \times 10^{15}/cm^2$, using film 30 and electrode 26 as a mask (FIG. 2E). PSG (phosphosilicate glass) film 32 was deposited to a thickness of 5,000 Å over the entire surface of the structure as a protective film. Annealing was then performed in a nitrogen atmosphere at a temperature of 900° C. for 20 minutes in order to electrically activate the ion-implanted impurities. This resulted in the formation of source region 35, consisting of regions 33a and region 34a; drain region 36, consisting of regions 33b and 34b, and p-pockets 37a and 37b. At the same time, the upper portion of the amorphous silicon layer of gate electrode 26 was converted into a polycrystalline silicon layer. The surface resistance of gate electrode 26 did not increase. Contact holes 38 were then formed by selectively removing portions of PSG film 32 corresponding to regions 34a and 34b. Aluminum was deposited to a thickness of about 1.0 μm over the entire surface, and patterned to obtain Al electrode 39, resulting in an n-channel MOS transistor having an LDD/p-pocket structure (FIG. 2F).

According to the above embodiment, undoped polycrystalline silicon layer 24 was formed on silicon substrate 21 through oxide film 23. Phosphorus was then diffused in substrate 21 using a POCl₃ technique, and amorphous silicon layer 25 was formed by ion-implanting silicon in the upper portion of layer 24. As a result, the penetration of boron ions through gate electrode 26 and gate oxide film 27 into substrate 21 during the ion implantation of boron (for p-pocket formation) can be prevented. In other words, the boron ions are stopped at the polycrystalline silicon layer or the amorphous silicon layer of gate electrode 26, thus preventing the channeling phenomenon and guaranteeing a constant threshold voltage.

In the embodiment described above, phosphorus was used as an impurity to convert a polycrystalline silicon layer into an n-conductivity type layer, but boron or the like can also be used to convert the layer into a p-conductivity type layer.

In the embodiment described above, only the upper portion of the polycrystalline layer was converted into an amorphous silicon layer, but it is also possible to convert the entire polycrystalline layer into an amorphous silicon layer.

In the embodiment described above, the present invention was applied to the manufacture of an n-channel MOS transistor having an LDD/p-pocket structure. The present invention, however, is not limited to this. It is equally effective in the prevention of ion penetration through the gate electrode and the like during ion implantation of boron for forming p-channel source and drain regions in a CMOS IC, in which n- and p-channel transistors are formed together on the same substrate.

What is claimed is:

1. A method of manufacturing a semiconductor device, comprising the steps of:
    forming an insulating film on a semiconductor substrate;
    forming a polycrystalline silicon layer on said insulating film;
    converting all of said polycrystalline silicon layer, or a portion of said polycrystalline silicon layer of a predetermined thickness, into an amorphous silicon layer;
    forming a patterned layer by patterning said polycrystalline silicon layer, either all of which or a portion of which of a predetermined thickness, has been converted into an amorphous silicon layer; and
    ion-implanting an impurity in said semiconductor substrate using said patterned layer as a mask.

2. A method according to claim 1, wherein said converting step comprises a step of performing ion implantation in said polycrystalline silicon layer.

3. A method according to claim 1, wherein said portion of predetermined thickness is a surface portion of said polycrystalline silicon layer.

4. A method according to claim 2, wherein the ion to be ion-implanted has a large atomic radius and is of an n-conductivity type.

5. A method according to claim 2, wherein the ion to be ion-implanted is an ion selected from the group consisting of silicon, fluorine, and argon ions.

* * * * *